United States Patent [19]

Ahuja

[11] Patent Number: 4,771,451

[45] Date of Patent: * Sep. 13, 1988

[54] POLARITY RING DIRECTOR

[75] Inventor: Om Ahuja, Houston, Tex.

[73] Assignee: Om Electronic Systems Corporation, Houston, Tex.

[*] Notice: The portion of the term of this patent subsequent to May 26, 2004 has been disclaimed.

[21] Appl. No.: 51,507

[22] Filed: May 18, 1987

Related U.S. Application Data

[63] Continuation of Ser. No. 753,710, Jul. 10, 1985, Pat. No. 4,669,111, which is a continuation-in-part of Ser. No. 633,107, Jul. 20, 1984, abandoned.

[51] Int. Cl.$^4$ .................. H04M 3/16; H04M 19/02
[52] U.S. Cl. .................................................. 379/181
[58] Field of Search ............... 379/181, 22, 26, 179; 307/632, 646; 340/825.42, 825.59

[56] References Cited

U.S. PATENT DOCUMENTS

| | | | |
|---|---|---|---|
| 3,916,111 | 10/1975 | Ott | 179/17 E |
| 4,021,617 | 5/1977 | Jones, Jr. et al. | 179/17 E |
| 4,056,694 | 11/1977 | Brolin | 179/84 R |
| 4,293,737 | 10/1981 | Cepelinski | 179/17 E |
| 4,310,723 | 1/1982 | Svala | 179/17 E |
| 4,331,838 | 5/1982 | Simokat | 179/17 E |
| 4,459,435 | 7/1984 | Foldvary et al. | 179/84 C |
| 4,669,111 | 5/1987 | Ahuja | 379/181 |

OTHER PUBLICATIONS

Bell System Practices, AT&T Co. Standard, 28A Ringer Isolator, Section 501-375-101, Issure 3, Oct. 1980.
Transcom TPI 28 Circuit Diagram of Ring Isolator.

*Primary Examiner*—Stafford D. Schreyer
*Attorney, Agent, or Firm*—Alton W. Payne

[57] ABSTRACT

A polarity ring director for designating a specific party in a multi-party telephone system using polarity encoding to ring only a specific party's telephone includes a solid state bipolar switch connected in series with the subscriber telephone line. The bipolar switch is unipolar in one polarity to pass DC signals and is selectively unipolar in the opposite polarity to selectively pass AC signals in response to a pilot signal to ring the subscriber's telephone. A pilot switch is responsive to polarity encoded line conditions for generating the pilot signal. A polarity detection circuit responsive to a predetermined pattern of AC and DC voltages superimposed on three input channels selectively enables or disables the pilot switch. A telephone line addressing means couples the tip, ring and ground lines of a telphone system in a predetermined pattern to the three input channels.

7 Claims, 3 Drawing Sheets

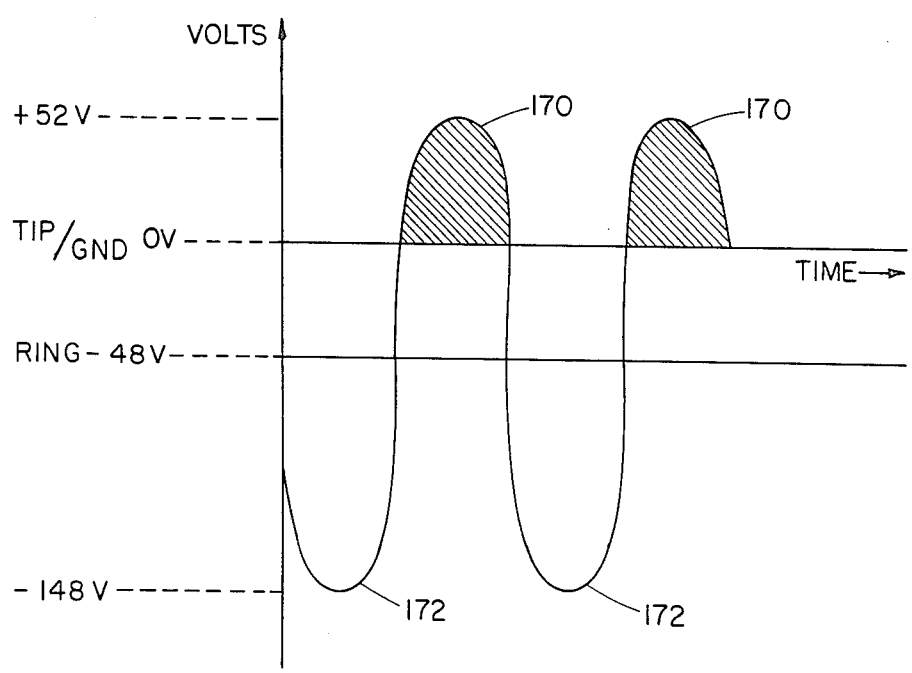

4,771,451

POLARITY RING DIRECTOR

CROSS-REFERENCE TO RELATED APPLICATION

This application is a continuation of applicant's pending application, "Polarity Ring Director" U.S. Ser. No. 753,710, filed July 10, 1985, now U.S. Pat. No. 4,669,111, which is a continuation-in-part of the applicant's prior application "Remote Actuated Switch" U.S. Ser. No. 633,107, filed July 20, 1984, now abandoned.

BACKGROUND OF THE INVENTION

1. Field of the Invention

This invention relates generally to multi-party telephone lines and, more particularly, to a device for providing selective ringing of a specific party in a multi-party telephone system using polarity encoding.

2. Description of the Prior Art

In a multi-party telephone system, several customers have their phone equipment running off of a single telephone company network tip, ring and ground circuit. It is necessary, in this type of system, to provide a means for the telephone central office to selectively ring only one of the parties. One such means is for the central office to polarize the wiring to the ringers of each of the customer's phones. Each customer's phone is polarized in a different manner so that by polarity encoding the ring signal from the central office, only the intended party's phone would ring while the other party's phones would not ring. The ringer for each phone must be wired differently, polarity-wise, from the other phones in the multi-party system. This requires that the phones be specially wired and provided by the telephone company.

However, in the present deregulated environment, it is mandatory that the customer be able to buy and own his own equipment. The commercially available phones all come with ringers wired across tip and ring only, and hence in one and the same polarity. Thus, there is a need for a device that can be easily connected to the subscriber's phone for selectively verifying the proper polarity from the central office and ringing only the intended party.

One such system is disclosed in U.S. Pat. No. 4,310,723 issued to Svala, disclosing a polarity-selective ringing device for use in a two-party system. Unipolar diodes are connected in the speech and ringer circuits in opposite directions for each of the parties. Sensors provide party identification by sensing the direction of the current flow in the line and thereby provide the correct line polarity for the identified party. The system is limited in that it is only for use in a two-party line system.

SUMMARY OF THE INVENTION

In accordance with the present invention, a polarity ring director (PRD) device is provided for selectively ringing a specific party within a multi-party line. The device can provide selectability for up to four parties. In addition, selectability for eight parties can be provided in the case of pulse coded ringing or semi-selective ringing. The PRD of the present invention includes a solid state switch means connected in series with one of the subscriber telephone lines which are designated tip and ring. The solid state switch is unipolar in one polarity to pass DC output signals and is selectively unipolar in the opposite polarity to selectively pass AC current in response to a pilot signal to ring the subscriber's telephone. A pilot switch means responsive to polarity encoded line conditions is provided to generate a pilot signal for the solid state switch means. A polarity detection means responsive to a predetermined pattern of AC and DC voltages superimposed on three input channels selectively enables or disables the pilot switch in response the predetermined pattern detected on the input channels. A telephone addressing means couples the tip and ring lines and ground of a telephone system in a predetermined pattern to the three input channels.

The solid state switch includes a bipolar switch connected in series with the subscriber telephone line and having a gate for rendering the switch conductive in response to a gate trigger current. A diode means connects the gate of the bipolar switch to the telephone line to normally close the bipolar switch for DC signals in one polarity. The bipolar switch is rendered AC conductive in response to the pilot signal generated from the pilot switch. The closing of the bipolar switch for DC signals in one polarity permits the bipolar switch to conduct when the subscriber goes off hook to make a call. A DC talk battery voltage is normally applied on the subscriber line by the central office. Generally, the talk battery voltage is applied with the tip being positive and the ring being negative which will produce a DC current flow from tip to ring when the subscriber goes off hook. The detection of this DC current by the central office signals the central office to provide the dial tone. The bipolar solid state switch is generally connected in series with the tip line and the diode means permits conduction from tip to ring to allow the subscriber to make outgoing calls.

The ringing voltage is an AC voltage that alternately charges and discharges a capacitor in the subscriber's phone to cause a bell in the phone to ring. By providing that the bipolar switch selectively pass AC signals, the device controls the operation of the ringer.

The pilot switch may be a field effect transistor having a source and drain terminals connected across the gate of the bipolar switch and the telephone line and a gate terminal for rendering the FET switch conductive in response to the polarity encoded line conditions. With the FET switch being conductive, the bipolar switch will pass AC current and thereby permit the subscriber's telephone to ring.

A polarity detection and verification means that is responsive to the predetermined pattern of AC and DC voltages includes a first voltage and polarity sensitive circuit imposed across first and second channels to energize a first voltage and polarity condition switch when the voltage and polarity are correct. A second voltage and polarity sensitive circuit is connected between the output of the first voltage and polarity condition switch and a third channel to energize a second voltage and polarity condition switch when the voltage and polarity are correct. A disable circuit means is responsive to the output of the second voltage and polarity condition switch to energize the pilot switch when the voltage and polarity condition across all three channels are satisfied. A switching means may be provided between the output of the second voltage and polarity condition switch and the disable circuit to actuate the disable circuit.

In a four party line system, each party will have a separate polarity address set by the telephone line addressing circuit. The addressing circuit couples the tip, ring and ground lines of the telephone system in a preselected pattern to the first, second and third input channels of the polarity verification means.

The telephone central office then polarity encodes the ringing voltage placed on the multi party line to match the polarity of the addressee being called. The polarity verification circuit of each party's PRD detects the polarity condition of the line. The proper polarity is verified by the first and second polarity condition switches becoming conductive. Only the PRD of the desired subscriber will verify the proper polarity. The disable circuit enables the pilot switch which permits the AC ringing voltage to pass through the bipolar switch and allow the subscriber's phone to ring.

BRIEF DESCRIPTION OF THE DRAWINGS

FIG. 5 is a polarity addressing wiring diagram.

FIG. 6 is a polarity encoding wiring diagram.

FIG. 7 is a graph of the ringing voltage superimposed on the ring line.

DETAILED DESCRIPTION OF THE INVENTION

Figure 1:
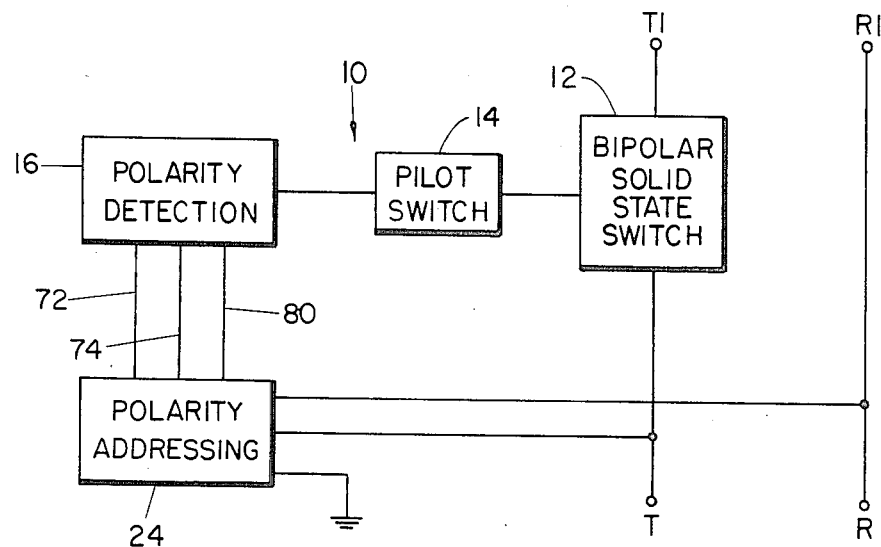
FIG. 1 is a block diagram of the polarity ringing director of the present invention.

FIG. 1 shows a block diagram of the PRD of the present invention connected within the tip, T and ring, R lines of the subscriber telephone line. The T1 and R1 junctions are connected to the subscriber telephone. PRD 10 includes a bipolar solid state switch 12 connected in series with the tip line. It should be understood that the switch 12 may alternatively be connected in the ring line. The switch 12 is unipolar in one polarity, that polarity being where tip is positive and ring is negative, to pass the DC talk battery voltage. Switch 12 is selectively unipolar in the opposite polarity to selectively pass the AC ringing voltage in response to a pilot signal to ring the subscriber's telephone. A pilot switch 14 is connected to the bipolar switch 12 and is responsive to polarity encoded line conditions to generate a pilot signal for the bipolar switch. A polarity detection means 16 selectively enables or disables the pilot switch in response to a predetermined pattern of AC and DC voltages superimposed on three input channels 72, 74 and 80. A telephone line addressing means 24 couples the tip and ring lines and a ground line of the telephone system in a preselected pattern to the three input channels of the detection means 16. The central office encodes the ringing voltage placed on the line to match the address of the desired subscriber. The polarity detection means verifies the correct polarity and enables the pilot switch 14 which produces a pilot signal to render the bipolar switch 12 conductive to AC signals to allow the subscriber's phone to ring.

Figure 2:
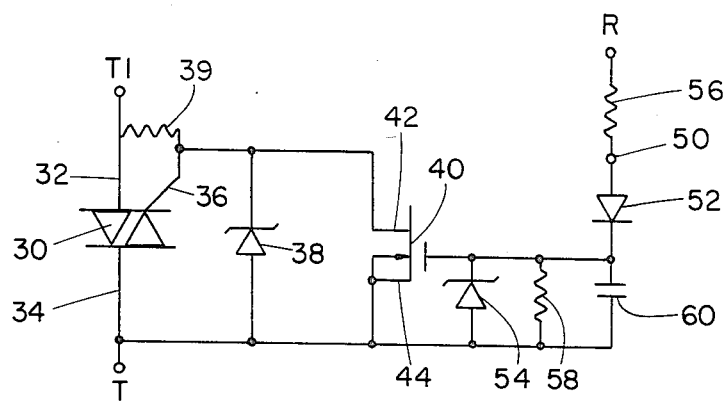
FIG. 2 is a schematic diagram of the solid state switch of the PRD.

The remote switch 12, as shown in FIG. 2, includes a solid state bipolar switch 30 having first and second terminals 32 and 34 connected in series with either the tip or ring line, and a gate 36 for rendering the switch 12 conductive between the terminals 32 and 34 in response to a predetermined current level. The switch 30 is shown in FIG. 2 as being connected within the tip line. The bipolar switch 30 may be any gate controlled turn-on solid state switch such as a triac. A zener diode 38 is connected across the gate 36 and the tip line at the second terminal 34 of the switch 30 to render the switch 30 normally unipolar in one polarity and to provide over voltage protection for the pilot switch 40.

In normal on hook conditions, the subscriber's phone has a capacitor charged to the talk battery voltage, usually 48 volts DC, provided on the line by the central office. If the subscriber goes off hook to make a call, a resistor within the telephone comes within the line producing a current that can flow through the diode 38, the gate 36 and the switch 30, thereby turning the switch 30 on to permit the subscriber to make the call. The diode 38 renders the switch 30 unipolar by having a breakover voltage higher than peak ringing voltage superimposed on the talk voltage, thereby only permitting current to flow through the switch 30 in one direction in the talk or ringing mode.

Resistor 39 is connected across the gate 36 and terminal 32 of bilateral switch 30 to prevent switch 12 from turning on below the design gate current of the bilateral switch 30. Resistor 39 acts as a shunt across the gate 36 and terminal 32 so that only when sufficient voltage is developed across resistor 39, representing the gate trigger voltage for the switch 30, will the switch 30 turn on. Thus, transient currents will be bypassed through resistor 39 to prevent switch 30 from being erroneouslly triggered and ringing a nonaddressed party.

The pilot switch 14 is a solid state unipolar switch 40, shown in FIG. 2 as a field effect transistor having a drain terminal 42 connected to the gate 36 of the switch 30 and a source terminal 44 connected to the tip line and the second terminal 34 of the switch 30. The gate 46 of the switch 40 is connected to a terminal 50 through a diode 52. The gate 46 is connected to the ring line through resistor 56. The FET 40 is turned on when ring is positive and tip is negative, which places a voltage across the gate 46 and the source 44. The polarity detection circuit 16 is connected to the terminal 50 for rendering the switch 40 selectively conductive in response to a signal from the polarity detection circuit 16. A zener diode 54 may be provided across the gate 46 and the source 44 of the switch 40 and a resistor 56 may be provided between the terminal 50 and the diode 52. The zener diode 54 and the resistor 56 provide over voltage and over current protection to the switch 40. The voltage across the gate 46 and source 44 is limited by the breakover voltage of the zener 54. Any voltage applied from the ring line higher than the rating of the zener 54 will drop across the resistor 56.

Resistor 56 and capacitor 60 forms an RC time constant for delaying the initial turn on of the FET 40 by the line AC ringing voltage. A resistor 58 and a capacitor 60 are connected across the gate 46 and the source 44 of the FET 40 to provide an RC time constant of sufficient length to keep the FET switch 40 on during the entire ringing cycle once the FET switch 40 has been enabled. In addition, to turn off the FET 40, when the voltage that enables the FET 40 is removed, the capacitor 60 will then discharge through the resistor 58. The small voltage stored in the FET 40 also discharges through resistor 58 thereby delaying opening the FET 40 between the terminals 42 and 44.

Figure 3:
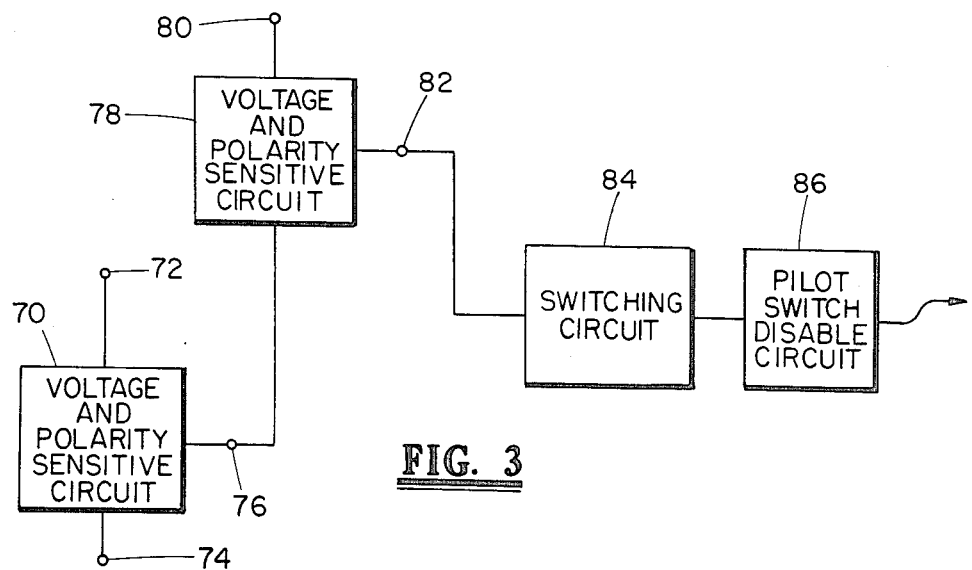
FIG. 3 is a block diagram of the polarity verification circuit.

A block diagram of the polarity detection circuit 16 is shown in FIG. 3 and includes a voltage and polarity sensitive circuit 70 connected across input addressing channels 72 and 74. The voltage and polarity sensitive circuit 70 will produce an output signal at terminal 76 when the voltage and polarity imposed across the channels 72 and 74 are correct. A second voltage and polarity sensitive circuit 78 is connected between the output terminal 76 of the circuit 70 and a third input addressing channel 80 to produce an output at terminal 82 when the voltage and polarity imposed across the channels 80 and 74 are correct. The output 82 is connected to a switching circuit 84 for disabling the pilot switch disable circuit 86. The pilot switch disable circuit 86 allows energization of the pilot switch 14 in response to an output from the circuit 78. In the absence of this output from circuit 78, the pilot switch disable circuit 86 normally disables pilot switch 14 in response to any ringing voltage across tip and ring.

Figure 4:
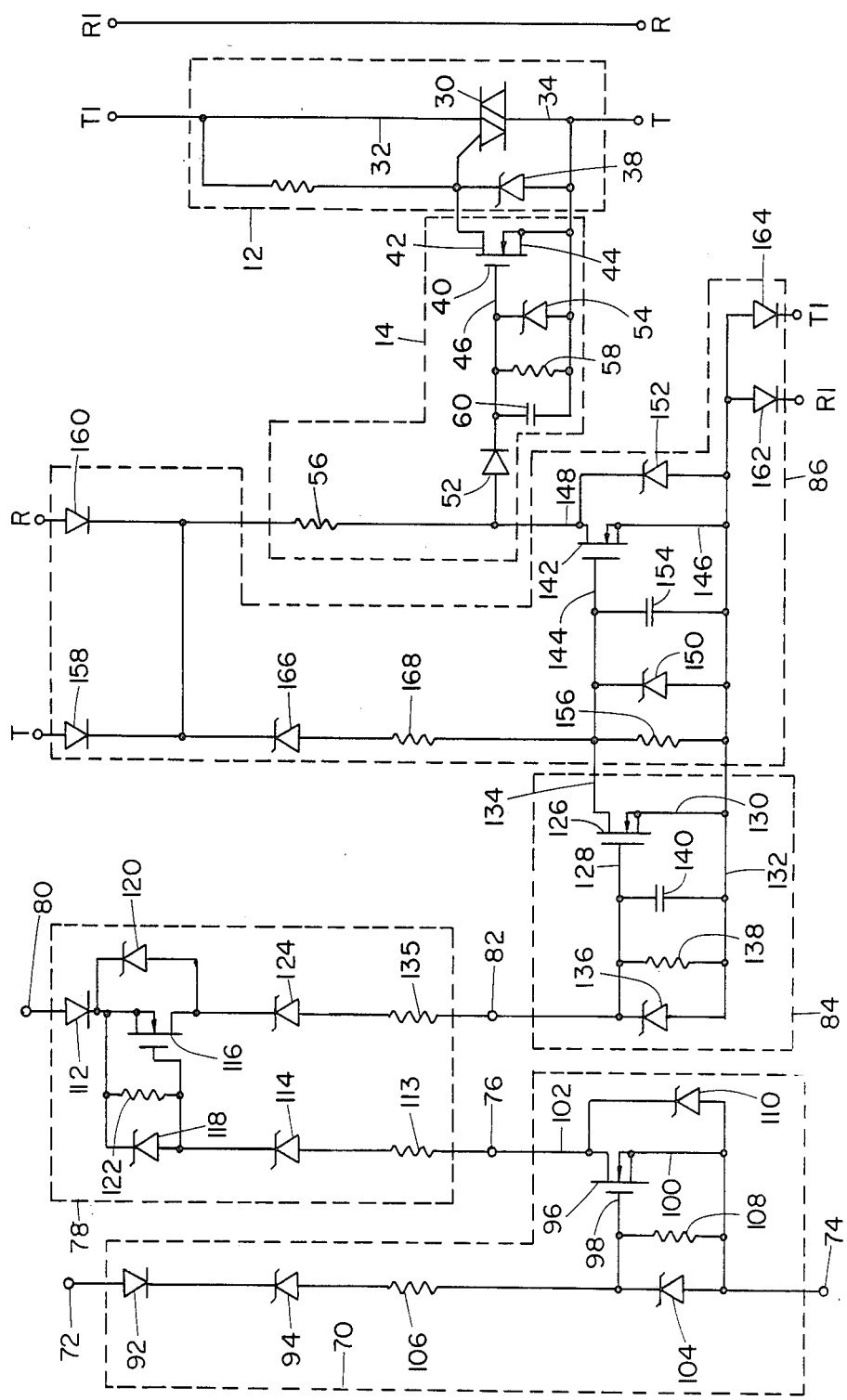
FIG. 4 is a schematic diagram of the PRD of the present invention.

FIG. 4 is a detailed schematic of a PRD of the present invention. The embodiment of FIG. 4 shows the three input channels 72, 80 and 74 of the voltage and polarity sensitive circuits 70 and 78. The three input channels are selectively connected within the tip, ring and ground telephone circuit of each party by the polarity addressing means 24 in a manner to be described later.

The voltage and polarity sensitive circuit 70 includes a diode 92 that permits conduction in a direction from 72 to 74 and a zener diode 94 that will block conduction from 72 to 74 unless the voltage exceeds the predetermined breakover voltage of the zener diode. The breakover voltage is selected to be higher than the normal talk battery voltage but lower than the ringing voltage. A polarity condition switch 96 is connected across the line between 72 and 74 and is energized when the voltage and polarity are correct. As shown in FIG. 4, the switch 96 is a FET having a gate 98 and source 100 connected to the line between 72 and 74. Drain 102 is connected to output 76 in the line going to channel 80. A zener diode 104 and a resistor 106 are voltage and current regulating devices to the gate 98 and a resistor 108 provides a discharge path for turning off FET 96 as described earlier in connection with the polarity switch 14. Zener diode 110 regulates the voltage across the source and drain of the FET 96.

The voltage and polarity sensitive circuit 78 includes a diode 112 and zener diode 114 for polarity and voltage sensing respectively. A polarity condition FET switch 116 is energized when the polarity and voltage between channels 80 and 74 are correct. The FET switch 116 is also provided with voltage protection zener diodes 118 and 120. In addition, current regulating resistor 113 and a turn off resistor 122 are also provided. The voltage and polarity circuit 78 further includes zener diode 124 that in conjunction with the diode 112 will permit the FET switch 116 to produce an output at terminal 82 only when the polarity and voltage between channel 80 and the negative rail 132 are correct.

As shown in FIG. 4, the output 82 energizes the switching circuit 84 which includes a FET switch 126 having a gate 128 connected to the output 82 and a source 130 connected to the negative rail 132 of the circuit. The drain terminal 134 is connected to the pilot switch disable circuit 86. The FET switch 126 includes voltage protection zener diode 136, current regulating resistor 135, turn off resistor 138 and capacitor 140 connected across the gate 128 and source 130. The capacitor 140 and resistor 138 form a time constant circuit that keeps the FET switch 126 turned on during the entire ringing cycle. The ringing cycle consists of an AC ringing voltage signal superimposed on the polarized talk battery separated by the pauses of only talk battery. Generally, the voltage lasts for two seconds with pauses of 4 seconds between each ring. The RC time constant is large enough so that the discharge of the FET 126 during the pauses will be sufficiently slow so that the voltage will only drop a small amount before being recharged again by the next ringing voltage signal. Thus, the FET switch 126 does not shut off between rings and remains on during the entire ringing cycle.

The pilot switch disable circuit 86 includes a FET switch 142 having a gate 144 connected to the drain 134 of the FET switch 126. The source 146 of the FET 142 is connected to the negative rail 132 and the drain 148 is connected to the pilot switch 14. The FET switch 142 includes voltage protection zeners 150 and 152 and capacitor and resistor 154 and 156 that combine to form an RC time constant sufficient to keep the switch 142 on during the entire ringing cycle as described above. The pilot switch disable circuit 86 includes a diode bridge including diodes 158, 160, 162 and 164 that are connected across the tip and ring lines. Zener diode 166 and current limiting resistor 168 are connected between the diode bridge and the gate 144 of the switch 142. The diode bridge permits the FET switch 142 to be turned on regardless of the polarity, with respect to the tip and ring, of the ringing voltage.

The polarity addressing means 24 is a means for coupling the tip, ring and ground lines of the telephone system in a preselected pattern to the channels 72, 74 and 80 of the polarity detection circuit 16. The polarity addressing means 24 can be any combination of single pole switches, double pole-double throw or triple pole-triple throw switches that can connect the channels to the tip, ring and ground lines in accordance with the addressing diagram in FIG. 5. The addressing diagram in FIG. 5 is made in conjunction with the polarity diagram of FIG. 6. The diagram in FIG. 6 shows the four different polarity encoding schemes used by the telephone central office when encoding the ringing voltage. While describing the schematic of FIG. 4, reference is made to FIGS. 5 and 6 as necessary.

In operation, the ringing voltage, which is in excess of the breakover voltage of the zener diodes 94, avalanches zener diode 94 provided the polarity is such that 72 is positive and 74 is negative. The zener diode 94 will conduct and produce a current across the resistor 108 which results in a voltage potential at the gate 98 to turn on the FET switch 96. The voltage potential at gate 98 of the FET 96 permits conduction between the source and drain terminals 100 and 102. The ringing voltage will also breakover the zener diode 114 provided the channel 80 is positive with respect to channel 74. Current will then flow through the line between 80 and 74 which will produce a voltage potential at the gate of FET 116 to turn on the FET 116. Similarily, the ringing voltage will breakover the zener diode 124 which will permit current to flow from 80 through FET switch 116 through zener 124 to output terminal 82. Current will then flow to the gate 128 to produce a potential at the gate 128 to turn on the FET switch 126 and to the negative rail 132.

Referring to FIGS. 5 and 6, for party 1, channel 72 is connected to ground, channel 80 is connected to tip and channel 74 is connected to ring. The polarity detection circuit 16 will produce an output at terminal 82, only if the tip and ground terminals are more positive with respect to the ring to produce the required current flow from 72 and 80 to 74. As shown in FIG. 6, the central office will then encode the ringing voltage by connecting the tip and ground terminals to positive and the ring terminal to negative talk battery. Parties 2, 3 and 4 are similarly addressed and the ringing voltage is encoded as shown in FIGS. 5 and 6. Current will flow from the output terminal 82 through the negative rail 132 to diodes 162 or 164 depending on the polarity of the ringing voltage. For example, for party 1, channel 80 is connected to tip which is more positive with respect to ring. Current will therefore flow through the diode 162 to the ring line since channel 80 and diode 164 are at the same potential.

In the on hook condition, the entire 48 volts talk battery is across tip and ring, which is greater than the avalanche voltage of zener diode 166. The talk battery voltage maintains the capacitor 154 fully charged to keep switch 142 on at all times. Therefore, switch 142 holds switch 40 off during normal on hook condition.

Concurrent with the polarity detection, the ringing voltage passes through the diodes 158 or 160 and avalanches the zener 166 to maintain on the FET switch 142 of the pilot switch disable circuit 86. The ringing voltage also passes through the RC time constant circuit of resistor 56 and capacitor 60 which delays the turn on of the switch 40. The FET switch 142 is actuated during this delay time. The delay time permits the analysis of the incoming voltage without passing any voltage to the subscriber phone. The FET switch 142 being conductive renders the pilot switch 40 nonconductive to preventing the ringing voltage from ringing the subscriber's phone. When the FET switch 142 is conductive between the source and drain terminals 146 and 148, the ringing voltage will be drawn through the FET 142 to the negative rail 132 which will prevent the FET 40 from being charged. If the correct polarity is detected, the FET 126 is rendered conductive which removes the ringing voltage from the gate 144 of the FET 142 to turn the FET 142 off. The ringing voltage will then be able to charge and turn on the FET 40 of the pilot switch 14. FET switch 40, when conductive, renders the bipolar switch 30 conductive to AC signals thus permitting the subscriber's phone to ring.

FIG. 7 graphically shows the ring voltage superimposed over the talk battery for party 1 of FIG. 6. The talk battery voltage is applied to the ring line. As shown in FIG. 7, the ring line is at −48 volts with respect to tip and ground. The ringing voltage, for party 1, is superimposed on the ring line. Thus, for a ringing voltage of 100 volts peak, the negative peak will be at −148 volts while the positive peak will be at +52 volts with respect to tip. The darker portion at 170 indicates the portion of each ringing cycle in which the ring line is more positive with respect to tip, and the portion 172 of the ringing cycle is the portion where the tip line is more positive with respect to ring. In portion 172, the switch 12 conducts to charge the capacitor in the ringer to the full −148 volts. However, as the ringing voltage goes into the darker portion 170, switch 12 does not conduct because the zener diode 38 will block conduction when the ring line is more positive with respect to tip. The breakover voltage of the zener 38 is selected to be greater than the peak to peak ringing voltage. Therefore, the ringer capacitor in the phone cannot discharge which prevents the phone from ringing. The capacitor discharge path is provided when the switch 40 is turned on. This path is through terminals 42 and 44 of the switch 40 which provides the means to render the triac 30 conductive for the entire AC ringing voltage.

While illustrative embodiments of the subject invention have been described and illustrated, it is obvious that various changes and modifications can be made therein without departing from the spirit of the present invention we should be limited only by the scope of the appended claims.

What is claimed is:

1. A polarity ring director for use in a multiparty telephone system having tip, ring and ground conductors and polarity encoding thereon for designating a specific party's telephone to ring, said polarity ring director comprising:

switch means connected in series with a subscriber telephone line to selectively pass AC ring currents therethrough in response to a pilot signal to thereby ring the subscriber's telephone;

pilot switch means responsive to polarity encoded line conditions to generate a pilot signal for said switch means;

polarity detection means responsive to a predetermined pattern of AC and DC voltages superimposed on three input channels to selectively enable or disable said pilot switch in response to a predetermined pattern detected on said input channels; and telephone line addressing means for coupling the tip, ring and ground lines of a telephone system in a predetermined pattern to said three input channels.

2. The polarity ring director of claim 1 wherein said polarity detection means includes:

a first voltage and polarity sensitive circuit imposed across the first and second channels to energize a first polarity and voltage condition switch when the voltage and polarity are correct;

a second voltage and polarity sensitive circuit connected between the output of the first polarity and voltage condition switch and the third channel to energize a second polarity and voltage condition switch when the voltage and polarity are correct; and circuit means responsive to the output of the second polarity and voltage condition switch to energize said pilot switch when said voltage and polarity conditions across all three channels are satisfied.

3. A polarity ring director for use in a multiparty telephone system having tip, ring and ground conductors and polarity encoding thereon for designating a specific party's telephone to ring, said polarity ring director comprising:

telephone addressing means for coupling the tip, ring and ground lines of a telephone system in a preselected pattern to at least three input channels of the ring director;

a first voltage and polarity sensitive circuit imposed across a first and a second channel to energize a first polarity and voltage condition switch when the voltage and polarity are correct;

a second voltage and polarity sensitive circuit connected between the output of a first polarity and voltage condition switch and a third channel to energize a second polarity and voltage condition switch when the voltage and polarity are correct; and pilot switch circuit means responsive to the output of said polarity and voltage condition switches to generate a pilot signal when said voltage and polarity conditions across across at least three channels are satisfied; and switch means series connected between said telephone system and said telephone, said switch means responsive to said pilot signal to selectively pass an AC ring signal to the specific party's telephone when said voltage and polarity conditions across said three channels are satisfied.

4. The polarity ring director of claim 3 which further includes a switching circuit connecting the output of the second polarity condition switch to an enable-disable circuit.

5. The polarity detection device of claim 4 wherein said first and second polarity condition switches include transistors.

6. The polarity detection device of claim 4 wherein said enable-disable circuit includes a diode bridge connecting said circuit to the tip and ring lines.

7. The polarity detection device of claim 4 wherein said enable-disable circuit includes a transistor having a gate connected to the output of the second polarity condition switch to render said switch conductive or nonconductive in response to the voltage and polarity conditions.

* * * * *